United States Patent [19]

Mugler, III et al.

[11] Patent Number: 5,245,282
[45] Date of Patent: Sep. 14, 1993

[54] THREE-DIMENSIONAL MAGNETIC RESONANCE IMAGING

[75] Inventors: John P. Mugler, III; James R. Brookeman, both of Charlottesville, Va.

[73] Assignee: University of Virginia Alumni Patents Foundation, Charlottesville, Va.

[21] Appl. No.: 723,230

[22] Filed: Jun. 28, 1991

[51] Int. Cl.$^5$ .............................................. G01R 33/20
[52] U.S. Cl. ..................................................... 324/309
[58] Field of Search ............... 324/300, 307, 309, 312, 324/318, 322; 128/653.2

[56] References Cited

U.S. PATENT DOCUMENTS

| | | | |
|---|---|---|---|
| 4,797,616 | 1/1989 | Matsui et al. | 324/309 |
| 4,801,884 | 1/1989 | Oppelt et al. | 324/309 |
| 4,818,942 | 4/1989 | Rzedzian | 324/312 |
| 4,830,012 | 5/1989 | Riederer | 128/653 |
| 4,833,407 | 5/1989 | Holland et al. | 324/309 |
| 4,836,209 | 6/1989 | Nishimura | 128/653 |
| 4,843,321 | 6/1989 | Sotak | 324/309 |
| 4,856,528 | 8/1989 | Yang et al. | 128/653 |
| 4,895,157 | 1/1990 | Nambu | 128/653 |
| 4,901,019 | 2/1990 | Wedeen | 324/309 |
| 4,940,941 | 7/1990 | Rzedzian | 324/312 |
| 4,982,161 | 1/1991 | Twieg | 324/309 |
| 4,984,573 | 1/1991 | Leunbach | 128/653 |
| 4,986,272 | 1/1991 | Riederer et al. | 128/653 |
| 4,991,586 | 2/1991 | Mueller et al. | 128/653 |
| 4,993,075 | 2/1991 | Sekihara et al. | 382/6 K |
| 5,072,182 | 12/1991 | Derby et al. | 324/309 |
| 5,084,675 | 1/1992 | Reinfelder et al. | 324/309 |
| 5,087,880 | 2/1992 | Bruder et al. | 324/309 |
| 5,105,152 | 4/1992 | Pauly | 324/309 |
| 5,122,747 | 6/1992 | Reiderer et al. | 324/309 |

Primary Examiner—Michael J. Tokar
Attorney, Agent, or Firm—Sheldon H. Parker

[57] ABSTRACT

A new three-dimensional (3D) MR imaging pulse sequence can produce over 100 high-resolution, high-contrast images in as little as 6 minutes of imaging time. Without additional imaging time, this same image data can be post-processed to yield high-resolution, high-contrast images in any arbitrary orientation. Thus, this new pulse sequence technique provides detailed yet comprehensive coverage. The method of this invention relates to a preparation-acquisition-recovery sequence cycle. The first step is magnetization preparation (MP) period. The MP period can emply a series of RF pulses, gradient field pulses, and/or time delays to encode the desired contrast properties in the form of longitudinal magnetization. A data acquisition period includes at least two repetitions of a gradient echo sequence to acquire data for a fraction of k-space. A magnetization recovery period is provided which allows T1 and T2 relaxation before the start of the next sequence cycle. The MP, data acquisition and magnetization recovery steps are repeated until a predetermined k-space volume is sampled.

44 Claims, 7 Drawing Sheets

FIG 3A
FIG 3B
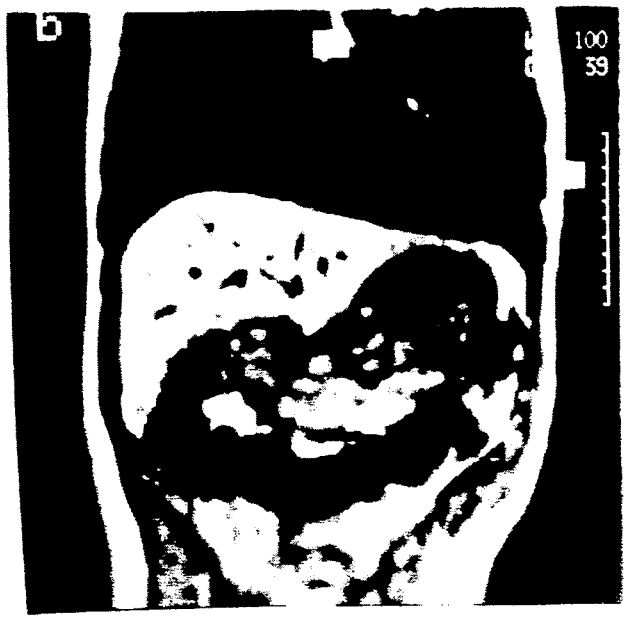

FIG 3C
FIG 3D
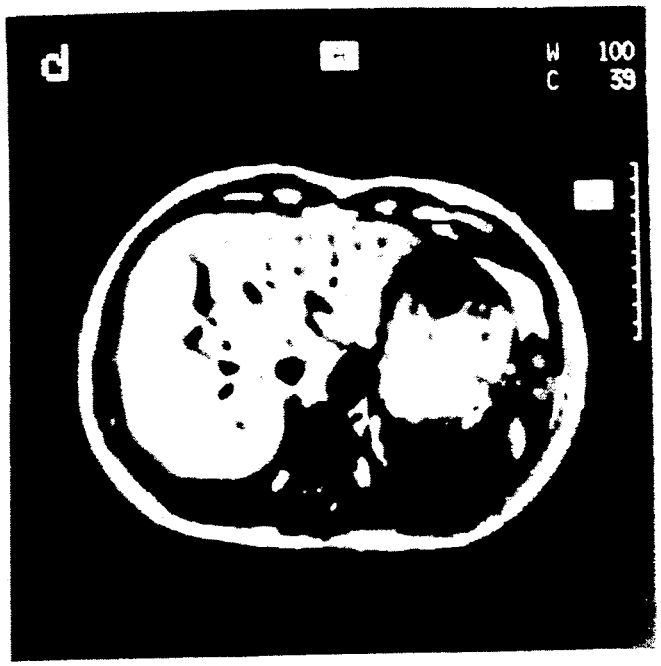

FIG 4A
FIG 4B
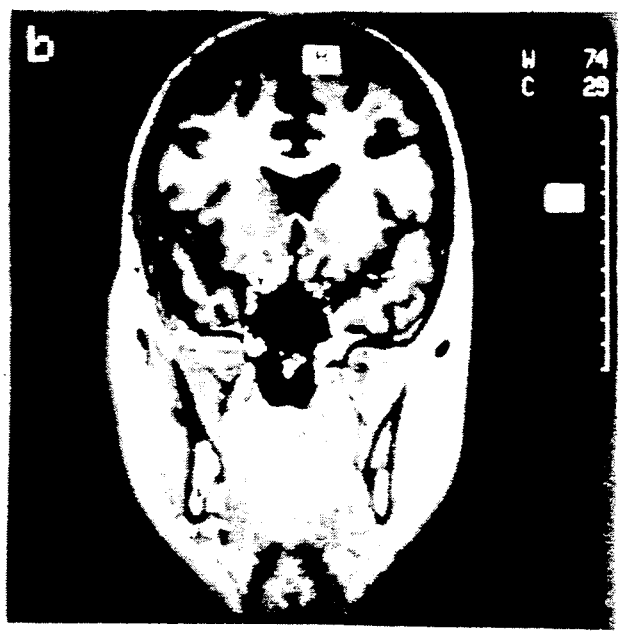

FIG 4C
FIG 4D
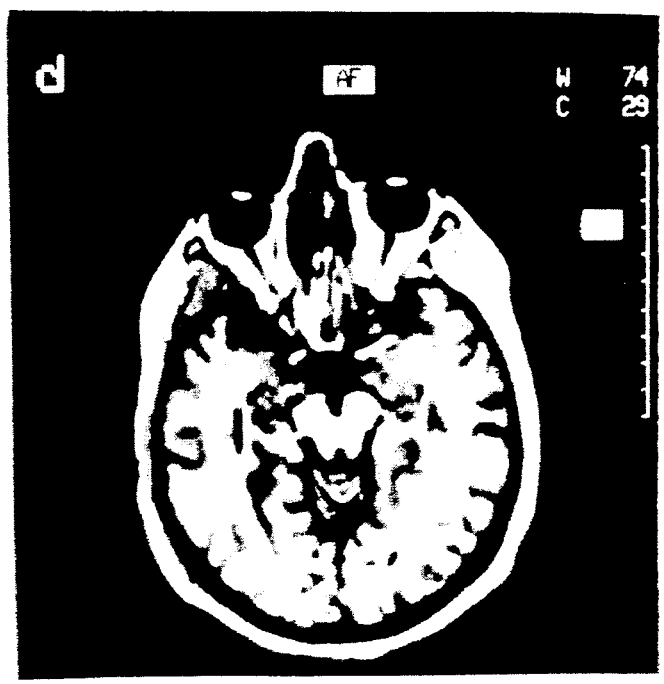

FIG 5
FIG 6
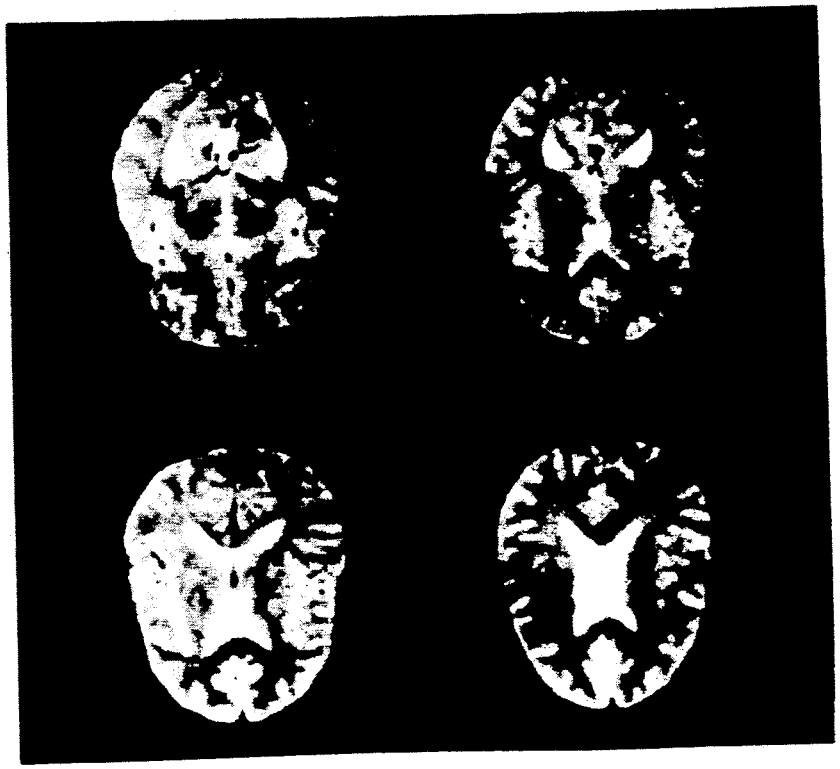

THREE-DIMENSIONAL MAGNETIC RESONANCE IMAGING

BACKGROUND OF THE INVENTION

1. Field of the Invention

The invention relates to magnetic resonance imaging, and more particularly to a rapid process for producing three-dimensional magnetic resonance imaging.

2. Description Of The Prior Art

Magnetic resonance imaging (MRI) is a non-invasive medical diagnostic imaging modality that can produce high-contrast tomographic images of the interior soft-tissue structures of the human body without the use of ionizing radiation. In many imaging applications, MRI has replaced the competing technology of X-ray computed tomography (CT) as the imaging method of choice. For an MRI examination, the subject is placed in a very strong static magnetic field, and the information necessary to create the images is generated using a series of magnetic field gradient pulses and radio-frequency (RF) pulses. The exact manner in which the gradient and RF pulses are applied is called the pulse sequence. By changing the pulse sequence, the relative appearance of different tissues and pathologies can be changed. Thus, the pulse sequence can be optimized to highlight certain pathological conditions, and even to create images of flow. There are literally an infinite number of possible pulse sequences. The potential variety of pulse sequences and the ability of different pulse sequences to produce images which highlight different types of information are major advantages of MRI compared to other techniques. Critical to the success and acceptance of MRI as a primary imaging modality has been the continued development of new pulse sequence techniques which have both improved the imaging capabilities in existing areas of clinical use and provided new clinical areas of application.

The importance of rapid imaging techniques is discussed in the Manual of Clinical Magnetic Resonance Imaging, (CMRI) by Heiken et al., Raven Press, New York, 1991. It is therein explained that the impetus for the development of rapid imaging techniques has been primarily twofold: to improve the efficiency of clinical MRI and to decrease artifacts that arise from cardiac, respiratory, and other patient motion. The synopsis of the more important rapid imaging techniques discussed in CMRI, at pages 24 through 39, is incorporated herein by reference, as though set forth in detail. At page 31, it is noted that steady state GE images with short TRs and low flip angles provide a myelogram effect in which the spinal cord can be easily differentiated from surrounding CSF.

SUMMARY OF THE INVENTION

It has now been found that a new three-dimensional (3D) MR imaging pulse sequence can produce over 100 high-resolution, high-contrast images in as little as 6 minutes of imaging time. Without additional imaging time, this same image data can be post-processed to yield high-resolution, high-contrast images in any arbitrary orientation. Thus, this new pulse sequence technique provides detailed yet comprehensive coverage. Compared to existing 3D MR imaging pulse sequences, our technique, called 3D MP RAGE, will potentially provide significant improvements in (1) the contrast and resolution that can be obtained in a given imaging time, (2) the variety of possible image contrast behaviors, and (3) the flexibility of the sequence structure to be adapted to different imaging requirements. The 3D MP RAGE technique can improve the imaging capabilities in some clinical areas (e.g., brain imaging) and provide new clinical capabilities in other areas (e.g., 3D abdominal imaging).

The method of this invention relates to a preparation-acquisition-recovery sequence cycle. The first step is magnetization preparation (MP) period. The MP period can emply a series of RF pulses, gradient field pulses, and/or time delays to encode the desired contrast properties in the form of longitudinal magnetization. At least one contrast property can be encoded by the magnetization preparation step. For example, T1-weighting combined with one of spatial or chemical presaturation can be encoded by the magnetization preparation step.

A data acquisition period includes at least two repetitions of a gradient echo sequence to acquire data for a fraction of k-space.

A magnetization recovery period is provided which allows T1 and T2 relaxation before the start of the next sequence cycle. The magnetization recovery period can have a time of zero. The time period employed for magnetization recovery can also be employed for magnetization preparation.

The MP, data acquisition and magnetization recovery steps are repeated until a predetermined k-space volume is sampled.

Advantageously, at least some of the preparation-acquisition-recovery sequences cycles are initiated by a trigger signal, whereby the sequence is synchronized with an external temporal event, such as respiration or heart beat.

Some or all of the RF pulses and/or gradient pulses applied during any of the steps can serve the purpose of stabilizing responses of the apparatus (such as eddy currents). In addition, or instead of the foregoing, some or all of the RF pulses and/or gradient pulses can be for the purpose of stabilizing the magnetization system, e.g., oscillations in signal strength.

The duration of any of the steps can be constant; alternatively, or in addition, the duration of at least one of the steps can vary from sequence cycle to cycle.

Some or all of the RF pulses can be spatially and/or chemically selective. The spatially selectivity can be in two or three dimensions. A given pulse can combine spatial and chemical selection.

Some or all of the RF pulses can be spatially and/or chemically non-selective.

The gradient-echo sequence can employ gradient or RF spoiling to reduce or eliminate the effects of residual transverse coherences. The gradient-echo sequence can employ a partially or fully rephased gradient structure and can employ flip angles which are constant or which vary within a given data acquisition period and/or between data acquisition periods. The gradient-echo sequence can employ an echo time and/or repetition time which is selected from the group consisting of constant, varying within a given data acquisition period, varying between data acquisition period, and varying both within and between data acquisition periods.

The gradient-echo sequence can employ a data sampling period which is either constant, varies within a given data acquisition period, varies between data acquisition periods, or which varies both within and between data acquisition periods. The gradient-echo sequence can employ either symmetric or asymmetric sampling of the echo thereby potentially acquiring only a half echo. The signal can be acquired in the presence of a single constant applied gradient, and the remaining spatial dimensions can be phase-encoded (standard Fourier transform phase encoding).

Further, the gradient echo sequence can acquire a plane, or a fraction of a plane, of k-space data during each sequence cycle. Alternatively, the k-space data collected by the gradient-echo sequence during a given sequence cycle might not be contained in any plane. The temporal order in which the k-space data is collected for each sequence cycle is determined based on achieving selected properties in the image, such as contrast, or selected properties of the corresponding point spread function. The temporal order of k-space data collection can be fixed or can vary from sequence cycle to cycle. The gradient-echo sequence can acquire a fixed or a varying amount of k-space data during each sequence cycle. The gradient-echo sequence can acquire data in the presence of from one to three time-varying applied gradients or in the presence of two or three constant applied gradients, and any remaining spatial dimensions employ standard phase encoding. The gradient-echo sequence can employ predetermined gradient waveforms to compensate, in the sampled signal, for phase shifts due to flow and/or motion. The compensations can be specifically designed for at least one of velocity, acceleration and higher orders of motion.

The data acquisition can be in the absence of any applied magnetic field gradients and from two to three spatial dimensions are encoded using standard phase-encoding. Thus, one dimension of the three or four dimensional data set, contains chemical shift information.

OBJECTS OF THE INVENTION

An object of the invention is provide improved imaging capabilities and to thereby provide increased patient throughput and reduced examination costs.

DRAWINGS

FIGS. 3A-3D are images produced in accordance with Example I.

FIGS. 4A-4D are images produced in accordance with Example II.

FIG. 5 is an image produced in accordance with Example III.

FIG. 6 is an image produced in accordance with Example IV.

DESCRIPTION OF THE PREFERRED EMBODIMENTS

Figure 1:
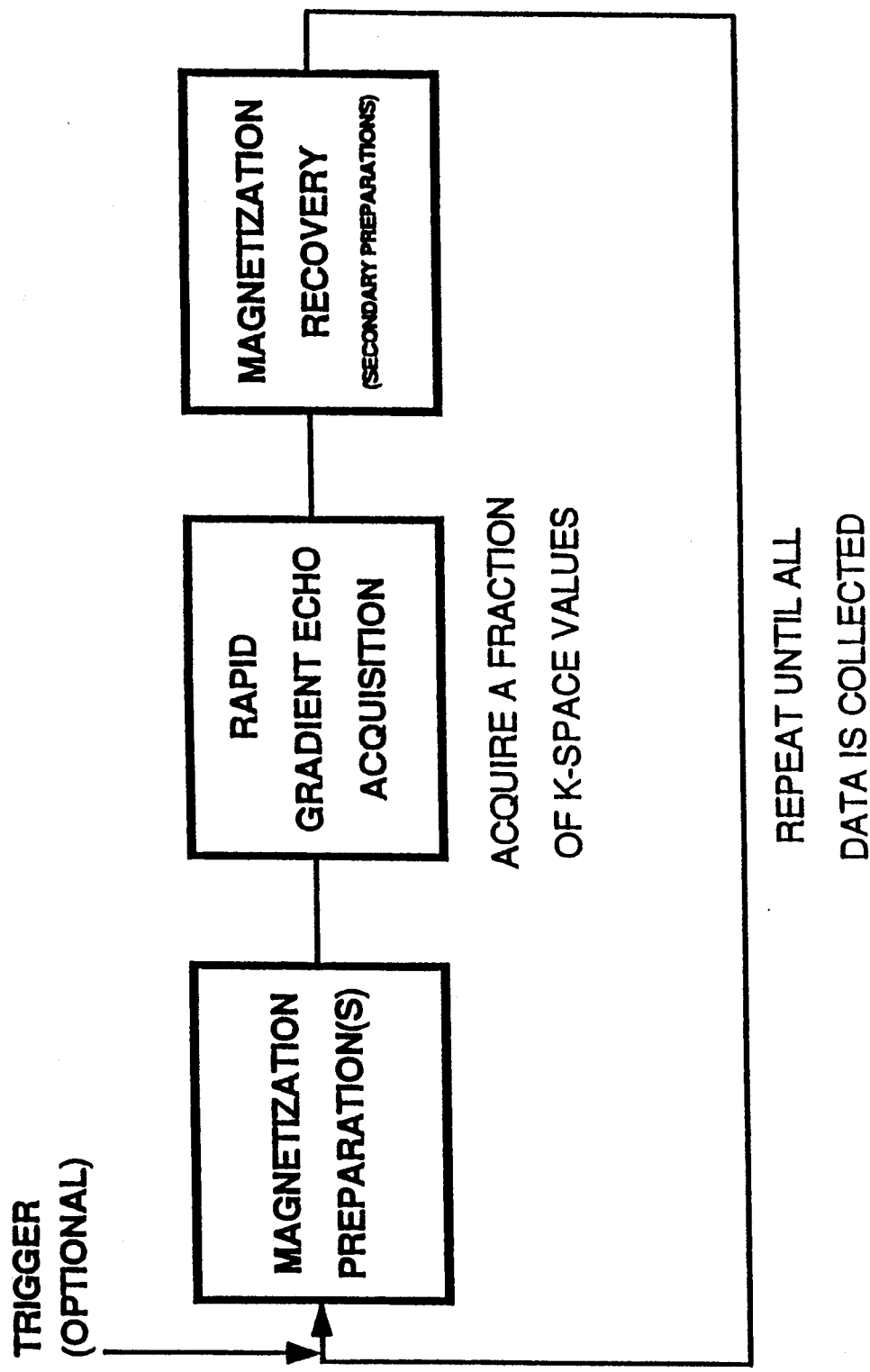
FIG. 1 is a schematic representation of 3D MP RAGE.
Figure 2:
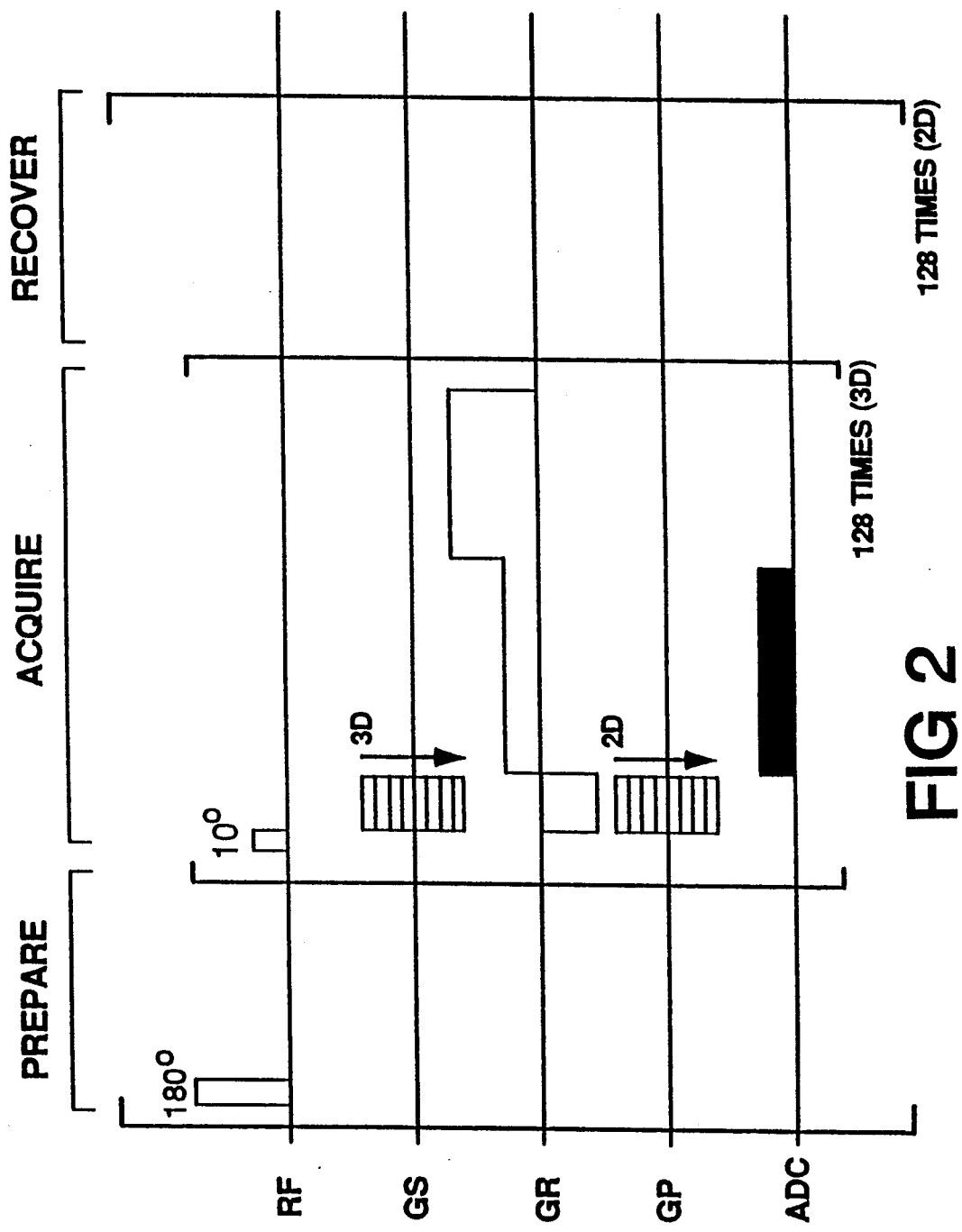
FIG. 2 is a timing diagram for a T1-weighted 3D MP RAGE sequence which employs a 180° pulse followed by a delay for preparation, and a FLASH gradient-echo sequence for data acquisition.

Since its introduction into general clinical use in the early 1980's, magnetic resonance imaging (MRI) has become a very important diagnostic tool that is employed routinely in the course of patient care. In many areas, MRI has replaced X-ray computed tomography (CT) as the diagnostic imaging study of choice. Critical to the success and acceptance of MRI as a primary imaging modality has been the continued development of new pulse sequence techniques which have both improved the imaging capabilities in existing areas of clinical use (e.g., brain imaging) and provided new clinical areas of application (e.g., magnetic resonance angiography). The new techniques can be classified into two general categories, those which improve the imaging capabilities in an existing area of clinical use (e.g., brain imaging), and those which provide imaging capabilities in a new clinical area (e.g., the development of magnetic resonance angiography techniques).

The three-dimensional (3D) MRI technique of the present invention employs a magnetization preparation-data acquisition-magnetization recovery cycle as the basic sequence element. Our new pulse sequence technique generalizes and extends the basic, prepare-acquire, philosophy introduced by Haase et al in 1989 with the snapshot FLASH technique.

By employing a distinct magnetization preparation period, the determination of the image contrast can be largely separated from the data acquisition. The image data is acquired using a rapid gradient-echo sequence. Additional control over the image contrast is provided by varying the duration of the magnetization recovery period. For convenience, reference to the new technique will be by the acronym 3D MP RAGE for 3-Dimensional Magnetization-Prepared Rapid Gradient-Echo imaging.

In experiments with 3D MP RAGE, high-quality 3D image sets ($128 \times 128 \times 256$ voxels) of the abdomen, were acquired showing minimal respiratory artifacts in just over 7 minutes (voxel size $2.7 \times 2.7 \times 2.7$ mm$^3$), and 3D image sets ($128 \times 128 \times 256$ voxels) of the head showing excellent gray matter/white matter contrast in less than 6 minutes (voxel size $1.0 \times 2.0 \times 1.4$ mm$^3$). The technique of the instant invention can produce high-resolution 3D image sets of the abdomen with minimal respiratory artifacts in an imaging period acceptable for routine clinical use.

3D MP RAGE can be applicable as a general screening pulse sequence for certain anatomical areas, and can result in significant reductions in patient exam time, thus providing increased patient throughput and decreased examination costs.

Since the magnetization is sampled during a transient that is dependent on the tissue T1 relaxation times, many aspects of the theoretical description and optimization of the sequence are even more difficult than was the case for existing steady-state imaging techniques. Before the 3D MP RAGE technique could be made available for widespread clinical application, it was essential that the intricacies of the contrast behavior be fully understood.

1. Three-Dimensional Imaging 2D versus 3D

Clinical magnetic resonance images are usually acquired as either a 2-dimensional (2D) plane or 3-dimensional (3D) volume of data. In either case, the image data is generally presented as a series of 2D slices. The reference axis determining the slice direction in the 3D case is based on the mechanics of the pulse sequence.

Each discrete intensity value (assuming a magnitude representation) in the image data represents an integral of the proton density, weighted by the T1 and T2 relaxation times, over a small volume (neglecting flow or other effects). For the standard Fourier transform imaging technique, the data values are equally spaced along each of 2 (or 3) mutually orthogonal axes corresponding to the read out direction and phase-encoding direction(s). In the 2D case, the integrand corresponding to the two in-plane directions is proportional to the inverse Fourier transform of any filter function applied to the spatial frequency data in the given direction. In the ideal case, assuming the data is not windowed with a smoothing function, the integrand is the weighted proton density times a sinc function, as disclosed in Bracewell RN. The Fourier Transform and its Applications, 2nd ed., McGraw-Hill, New York, 1978. For the axis perpendicular to the image plane, the integrand is the weighted proton density times the slice profile for the image, which is determined by the net effect of the radio frequency (RF) pulse or pulses in the sequence, as disclosed in Rosen B. R., Pykett I. L., Brady T. J. Spin Lattice Relaxation Time Measurements in Two-Dimensional Nuclear Magnetic Resonance Imaging: Corrections for Plane Selection and Pulse Sequence. J Comput Assist Tomogr 8, 195-199, 1984, Young I. R., Bydder G. M. Some Factors Involving Slice Shape which Affect Contrast in Nuclear Magnetic Resonance (NMR) Imaging, Ann Radiol (Paris) 28, 112-118, 1985, and Young I. R., Bryant D. J., Payne J. A. Variations in Slice Shape and Absorption as Artifacts in the Determination of Tissue Parameters in NMR Imaging. Magn Reson Med 2, 355-389, 1985. If multiple 2D slices are acquired by time-multiplexing the acquisitions for different slice positions as is usually done in standard 2D clinical imaging, the profile for a given slice becomes increasingly distorted as the distance between adjacent slices is decreased, as disclosed in Kneeland J.B., Shimakawa A., Wehrli F. W. Effect of Intersection Spacing on MR Image Contrast and Study Time. Radiology 158, 819-822, 1986, Crawley A. P., Henkelman R. M. A Stimulated Echo Artifact from Slice Interference in Magnetic Resonance Imaging. Med Phys 14, 842-848, 1987, Kucharczyk W., Crawley A. P., Kelly W. M., Henkelman R. M. Effect of Multislice Interference on Image Contrast in T2- and T1-weighted MR Images. AJNR 9, 443-451, 1988, and Schwaighofer BW, Kyle KY, Mattrey RF. Diagnostic Significance of Interslice Gap and Imaging Volume in Body MR Imaging. AJR 153, 629-632, 1989.

The cross-talk between closely spaced slices can be a disadvantage of 2D multi-slice acquisitions for closely spaced or contiguous slices, but we note that a tremendous amount of research effort has been dedicated to optimizing RF inversion, excitation, and refocusing profiles to minimize slice-to-slice interference, as disclosed for example in Warren W. S., Silver M., in Advances in Magnetic Resonance, Academic Press, 12, 248, 1988.

In the 3D case (neglecting any effects of the RF pulses), the integrand for all directions is proportional to the inverse Fourier transform of the corresponding filter function in spatial frequency space. Assuming ideal conditions and no data windowing, the multiplicative term (i.e., the point spread function or PSF) for the weighted proton density has the same form for each direction. This fact is advantageous if the image data is acquired with isotropic, or nearly isotropic, resolution and the 3D volume of data is reformatted to yield images in planes other than reference orientation. However, if the slice thickness (spacing in the second phase-encoding direction) is large compared to the in-plane resolution, truncation artifacts arising from the sidelobes of the PSF will be significantly worse in the slice direction as disclosed in Carlson J., Crooks L., Ortendahl D., et al., and Signal-to-Noise Ratio and Section Thickness in Two-dimensional versus Three-dimensional Fourier Transform MR Imaging. Radiology 166, 266-270, 1988.

Truncation artifacts in the third dimension usually become pronounced with slice thicknesses greater than about 2 to 3 mm, as disclosed in Carlson J., Crooks L., Ortendahl D., et al. Signal-to-Noise Ratio and Section Thickness in Two-dimensional versus Three-dimensional Fourier Transform MR Imaging. Radiology 166, 266-270, 1988.

Three-dimensional volume techniques can provide several advantages over two-dimensional multi-slice techniques. As discussed above, the 3D acquisition inherently provides contiguous slices and the functional form of the slice profile does not change with the spacing between the slices. If the 3D acquisition employs isotropic, or nearly isotropic, resolution, the volume data set can be reformatted to yield high-resolution contiguous image slices in any arbitrary orientation, as disclosed in Lai C-M, Lauterbur P. C. True Three-Dimensional Image Reconstruction by Nuclear Magnetic Resonance Zeugmatography. Phys Med Biol 5, 851-856, 1981, Buonanno F. S., Pykett I. L., Brady T. J., et al. Clinical Relevance of Two Different Nuclear Magnetic Resonance (NMR) Approaches to Imaging of a Low-Grade Astrocytoma. J Comput Assist Tomogr 6, 529-535, 1982, and Pykett I. L., Buonanno FS, Brady T. J., Kistler J. P. True Three-Dimensional Nuclear Magnetic Resonance Neuro-Imaging in Ischemic Stroke: Correlation of NMR, X-ray CT and Pathology. Stroke 14, 173-177, 1983.

In a 3D acquisition, the signal-to-noise ratio increases as the square root of the number of slices, since the slices are acquired through phase-encoding. However, the use of a second phase-encoding direction generally increases the sensitivity of 3D images to motion induced artifacts.

Whether 2D or 3D is more efficient in a given imaging situation depends on the repetition time TR, which is chosen based on the desired contrast behavior and the properties of the pulse sequence, and the minimum time for an excite-acquire cycle, TRmin, which is also dependent on the properties of the pulse sequence. The relative values of TR and TRmin determine how many different slice acquisitions can be time-multiplexed within TR. For the pulse sequence techniques in clinical use today, TRs greater than approximately 100 to 200 ms are usually best suited for 2D multi-slice imaging, whereas TRs significantly less than 100 ms are best suited to 3D volume imaging. There is of course an intermediate region where a hybrid approach, multiple 3D volume imaging, is applicable as disclosed in Wilk RM, Harms SE. Temporomandibular Joint: Multislab, Three-Dimensional Fourier Transform MR Imaging. Radiology 167, 861-863, 1988.

3D Clinical Imaging

In the early 1980's, 3D imaging results were reported for excised organs and human brains in-vivo. Initial human applications used saturation recovery and inversion recovery sequences, both of which employed 90 RF pulses for excitation, as disclosed in Buonanno FS, Pykett I. L., Brady T. J., et al. Clinical Relevance of Two Different Nuclear Magnetic Resonance (NMR) Approaches to Imaging of a Low-Grade Astrocytoma. J Comput Assist Tomogr 6, 529-535, 1982 and Pykett I. L., Buonanno FS, Brady T. J., Kistler J. P. True Three-Dimensional Nuclear Magnetic Resonance Neuro- Imaging in Ischemic Stroke: Correlation of NMR, X-ray CT and Pathology. Stroke 14, 173–177, 1983.

To achieve the desired contrast properties with these sequences, TRs of 200 ms or longer were necessary. A whole-head isotropic high-resolution (1 to 3 mm) data set required imaging 3D volume acquisitions were very high, the development and refinement of 2D multi-slice methods, combined with the relatively long imaging times required for high-resolution large-volume 3D acquisitions, diminished clinical interest in 3D techniques for several years.

For the in-plane image matrix sizes commonly employed (128 or 256), a TR of less than 100 ms is required for high-resolution large-volume (e.g., 64 or more phase-encoding steps in the third dimension) 3D image sets to be acquired in clinically reasonable times (less than approximately 15 minutes). This sequence requirement was met with the introduction in the mid-1980s of the short-TR, partial flip angle gradient-echo sequences, such as FLASH, FFE, GRASS, FAST and FISP. FLASH is disclosed in Haase A, Frahm J, Matthaei D, et al., FLASH Imaging. Rapid NMR Imaging Using Low Flip-Angle Pulses. J Magn Reson 67, 258–266, 1986, and FFE is disclosed in Van der Meulen P., Groen J. P., Cuppen J. J. M. Very Fast MR Imaging by Field Echoes and Small Angle Excitation. Magn Reson Imaging 3, 297–299, 1985. GRASS is disclosed in Utz J. A., Herfkens R. J., Glover G., Pelc N. Three Second Clinical NMR Images Using a Gradient Recalled Acquisition in a Steady State Mode (GRASS). Magn Reson Imaging 4, 106, 1986 (abstract), and FAST is disclosed in Gyngell ML. The Application of Steady-State Free Precession in Rapid 2DFT NMR Imaging: FAST and CE-FAST Sequences. Magn Reson Imaging 6, 415–419, 1988. FlSp is disclosed in Oppelt A., Graumann R., Barfuss H., et al. FISP—a New Fast MRI Sequence. Electromedica 54, 15–18, 1986. For example, a TR of 15 ms and a flip angle of 15° produced $128^3$ image sets of human hands and feet in only 4 minutes, as disclosed in Frahm et al. (Frahm J., Haase A., Matthaei D. Rapid Three-Dimensional MR Imaging Using the FLASH Technique. J Comput Assist Tomogr 10, 363–368, 1986). Three-dimensional sequences, dominated by the 3D gradient-echo techniques, have shown promising results for clinical application in the head as disclosed in Runge V. M., Wood ML, Kaufman D. M., et al. FLASH: Clinical Three-Dimensional Magnetic Resonance Imaging. Radiographics 8, 161, 1988, Hu X. P., Tan K. K., Levin D. N., et al. Three-Dimensional Magnetic Resonance Images of the Brain: Application to Neurosurgical Planning. J Neurosurg 72, 433–440, 1990), in the spine, as disclosed in Gallimore G. W. Jr, Harms S. E. Selective Three-Dimensional MR Imaging of the Spine. J Comput Assist Tomogr 11, 124–128, 1987 and Sherry C. S., Harms S. E., McCroskey W. K. Spinal MR Imaging: Multiplanar Representation from a Single High Resolution 3D Acquisition. J Comput Assist Tomogr 11, 859–862, 1987, and Tsuruda J. S., Norman D., Dillon W., et al. Three-Dimensional Gradient-Recalled MR Imaging as a Screening Tool for the Diagnosis of Cervical Radiculopathy. AJR 154, 375–383, 1990. The use in joints, is disclosed in Wilk R. M., Harms S. E. Temporomandibular Joint: Multislab, Three-Dimensional Fourier Transform MR Imaging. Radiology 167, 861–863, 1988, Harms S. E., Muschler G. Three-Dimensional MR Imaging of the Knee Using Surface Coils. J Comput Assist Tomogr 10, 773–777, 1986, Tyrell R. L., Gluckert K, Pathria M, Modic MT. Fast Three-Dimensional MR Imaging of the Knee: Comparison with Arthroscopy. Radiology 166, 865–872, 1988, Spritzer C. E., Vogler J. B., Martinez S., et al. MR Imaging of the Knee: Preliminary Results with a 3DFT GRASS Pulse Sequence. AJR 150, 597–603, 1988, Haggar A. M., Froelich J. W., Hearshen D. O., Sadasivan K. Meniscal Abnormalities of the Knee: 3DFT fast-scan GRASS MR Imaging. AJR 150, 1341–1344, 1988 and Solomon S. L., Totty W. G., Lee J. K. MR Imaging of the Knee: Comparison of Three-Dimensional FISP and Two-Dimensional Spin-Echo Pulse Sequences. Radiology 173, 739–742, 1989, Harms SE, Flamig D. P., Fisher C. F., Fulmer J. M. New Method for Fast MR Imaging of the Knee. Radiology 173, 743–750, 1989. Other applications include magnetic resonance angiography.

The 3D short-TR gradient-echo sequences can be divided into two general categories, those which employ a steady state of only the longitudinal component of the magnetization vector (e.g., FLASH, FFE) and those which employ a steady state of the complete magnetization vector (e.g., GRASS, FAST, FISP). The major practical difference between the two sequence categories is the resulting image contrast properties as disclosed in van der Meulen P, Groen J. P., Tinus A. M. C., Bruntink G. Fast Field Echo Imaging: An Overview and Contrast Calculations. Magn Reson Imaging 6, 355–368, 1988) and Tkach J. A., Haacke E. M. A Comparison of Fast Spin Echo and Gradient Field Echo Sequences. Magn Reson Imaging 6, 373–389, 1988. It is important to note that the 3D implementations of the longitudinal steady-state sequences, which are employed if T1-weighted contrast is desired, have been prone to slice-to-slice intensity banding artifacts as disclosed in Wood ML, Runge V. M. Artifacts Due to Residual Magnetization in Three-Dimensional Magnetic Resonance Imaging. Med Phys 15, 825–831, 1988. In these sequences, some type of spoiling is employed to destroy the coherence of the transverse magnetization after the echo signal is sampled. Therefore, the transverse magnetization generated by a given excitation pulse contributes only to the signal measured in the echo period immediately following the pulse. This is the ideal case, and if the spoiling is incomplete the residual transverse magnetization may create artifacts in the image. Traditionally, various combinations of magnetic field gradients have been employed in an attempt to eliminate these artifacts as disclosed in Wood ML, Runge V. M. Artifacts Due to Residual Magnetization in Three-Dimensional Magnetic Resonance Imaging. Med Phys 15, 825–831, 1988 and Frahm J., Hanicke W., Merboldt K-D. Transverse Coherence in Rapid FLASH NMR Imaging. J Magn Reson 72, 307–314, 1987 and Wood M. L., Silver M, Runge V. M. Optimization of Spoiler Gradients in FLASH MRI. Magn Reson Imaging 5, 455–463, 1987 and Crawley A. P., Wood M. L., Henkelman R. M. Elimination of Transverse Coherences in FLASH MRI. Magn Reson Med 8, 248–260, 1988. However, gradients alone generally have been found to be incapable of totally preventing the artifacts in the 3D case.

More recently, RF spoiling has been suggested as a method to eliminate these transverse coherence artifacts, as disclosed, for example in Crawley A. P., Wood M. L., Henkelman R. M. Elimination of Transverse Coherences in FLASH MRI. Magn Reson Med 8, 248–260, 1988. Zur Y., Bendel P. Elimination of the Steady State Transverse Magnetization in Short TR Imaging. "Book of Abstracts", Society of Magnetic Resonance in Medicine, 6th Annual Meeting, 440, 1987. Zur Y., Wood M. L., Neuringer L. J. Spoiling of Transverse Coherences without Spoiler Gradients. "Book of Abstracts", Society of Magnetic Resonance in Medicine, 9th Annual Meeting, 31, 1990, Murdoch JB. An Analysis of RF Phase Shift Spoiling and Its Effect on Contrast. "Works-in-Progress", Society of Magnetic Resonance in Medicine, 9th Annual Meeting, 1305,1990. This technique is now available on the imagers from several commercial vendors and clinical evaluations of the technique have begun as disclosed in Foo T. K. F., Bernstein M. A., Holsinger A. E., et al. UltraFast Spoiled Gradient Recalled (SPGR) Image Acquisition. "Works-in-Progress", Society of Magnetic Resonance in Medicine, 9th Annual Meeting, 1308, 1990.

Another class of sequences that have played a minor role in 3D imaging are the spin-echo sequences which employ pulse angles other than 90° for the RF excitation pulse as disclosed in Tkach J. A., Haacke E. M. A Comparison of Fast Spin Echo and Gradient Field Echo Sequences. Magn Reson Imaging 6, 373–389, 1988 and Mugler III J. P., Brookeman J. R. Rapid 3D Spin-Echo Imaging Using Large Flip Angle Excitation. Magn Reson Imaging 6(S1), 53, 1988 (abstract). These sequences can provide TR's of 100 ms or slightly less, yielding much more reasonable 3D acquisition times than the standard 90°–180° sequences. The 3D spin-echo sequences of course provide the advantage of a decreased sensitivity to artifacts from field inhomogeneities and susceptibility changes in comparison to their gradient echo counterparts. At higher field strengths, however, power deposition may be a problem due to the closely spaced 180° pulses. These 3D spin-echo sequences have not yet found widespread application.

Magnetization Prepared Imaging

The vast majority of pulse sequences in clinical use today employ a steady-state acquisition. This may be in the form of a steady state of the longitudinal component of the magnetization vector (e.g., spin-echo or FLASH) or of the complete magnetization vector (e.g., GRASS or FISP). In either case, each line (assuming a Fourier transform method) of spatial frequency space is equivalently weighted with respect to the tissue relaxation parameters. There are some notable exceptions which sample the magnetization during a transient, for example Echo-Planar, Hybrid imaging and RARE imaging, but these techniques have not yet found widespread clinical use. Echo-Planar is disclosed in Mansfield P. Multi-Planar Image Formation Using NMR Spin Echos J Phys C 10, L55, 1977. Hybrid imaging is disclosed in Haacke E. M., Bearden F. H., Clayton J. R., Linga N. R. Reduction of MR Imaging Time by the Hybrid Fast-Scan Technique. Radiology 158, 521–529, 1986 and RARE imaging is disclosed in J, Nauerth A., Friedburg H. RARE Imaging: A Fast Imaging Method for Clinical MR. Magn Reson Med 3, 823–833, 1986.

A pulse sequence technique, called snapshot FLASH imaging, is initiated by some type of contrast preparation, followed by a very rapid, or snapshot, FLASH image acquisition. The use of a distinct magnetization preparation period largely separates the generation of the image contrast from the acquisition of the 318 image data. Haase's snapshot FLASH sequence acquired a 64×128 image in less than 200 ms. The speed of this technique clearly makes it suitable for imaging certain dynamic processes or for reducing flow and motion artifacts. Decoupling the contrast preparation from the acquisition potentially provides many interesting applications. It is noted that the use of a contrast preparation followed by a rapid acquisition has also been demonstrated with echo-planar imaging as disclosed in Stehling M. K., Ordidge R. J., Coxon R, et al. Ultra-High-Speed Inversion Recovery Echo Planar MR Imaging: Technique and Application. Radiology 169(P), 377, 1988 (abstract). Stehling M. K., Ordidge R. J., Coxon R., Mansfield P. Inversion-Recovery Echo-Planar Imaging (I. R.-EPI) at 0.5T. Magn Reson Med 13, 514–517, 1990.

The snapshot FLASH technique is the first member of a rapidly growing new family of pulse sequences which employ as the basic sequence element a magnetization preparation period followed by a data acquisition period using a short-TR gradient-echo sequence. The acquisition period can employ any of the standard gradient-echo techniques, such as FLASH, GRASS or FISP, or specially modified gradient-echo techniques. The acquisition period should be relatively short compared to the T1 values of interest. The acronym applicable to the acquisition portion of this type of sequence is RAGE for rapid gradient echo. The 2D implementations of these magnetization prepared rapid gradient echo (MP RAGE) sequences have already shown very promising initial results for perfusion, cardiac and abdominal imaging The perfusion imaging is disclosed in Finelli D. A., Kiefer B., Deimling M., et al. Dynamic Contrast-Enhanced Perfusion Studies of the Brain with Snapshot FLASH. Radiology 173(P), 42, 1989 (abstract) and Atkinson D. J., Burstein D, Edelman R. R. Evaluation of First-Pass Cardiac Perfusion with Instant MR Imaging. Radiology 173(P), 358, 1989 (abstract). The cardiac imaging is disclosed in Haase A., Matthaei D., Henrich D., et al. Cardiac NMR Imaging Using Snapshot FLASH NMR. "Book of Abstracts", Society of Magnetic Resonance in Medicine, 8th Annual Meeting, 56, 1989 and Finelli D. A., Kiefer B., Lenz G., et al. Snapshot FLASH Imaging: Cardiac Applications. Radiology 173(P), 275, 1989 (abstract) and abdominal imaging is disclosed in de Lange E. E., Mugler III J. P., Gay S. B., et al. "Snapshot-FLASH" Imaging of the Liver. Magn Reson Imaging 8(S1), 52, 1990 (abstract) and Edelman R. R, Atkinson D. J., Wallner B., et al. Breath-Hold Abdominal STI. R. and T2-Weighted Imaging Using an Interleaved Ultrafast Gradient-Echo Sequence. "Works in Progress", Society for Magnetic Resonance Imaging, 8th Annual Meeting, 35, 1990.

In an MP RAGE sequence, the data acquisition occurs during a T1-dependent transient. Sampling the magnetization during a transient presents many technical problems with the design of MP RAGE sequences, analogous to some of those encountered with T2 decay in echo-planar and RARE imaging. Whereas the original technique of Haase acquires the complete image data in one-shot, there have already been extensions as disclosed in Edelman R. R, Atkinson D. J., Wallner B, et al. Breath-Hold Abdominal STI. R. and T2-Weighted Imaging Using an Interleaved Ultrafast Gradient-Echo Sequence. "Works in Progress", Society for Magnetic Resonance Imaging, 8th Annual Meeting, 35, 1990 and Bottcher U., Norris D., Leibfritz D. Sequential Inversion Recovery Snapshot-FLASH. Magn Reson Imaging 8(S1), 16, 1990 (abstract) to collecting the data for a 2D image in several distinct prepare-acquire cycles (i.e. a multi-shot approach), thus reducing the effects of the transient acquisition on the image contrast by employing a set of shorter RAGE acquisitions in place of the original longer RAGE acquisition.

Similar to earlier developments in echo-planar and RARE imaging, reordered phase encoding was investigated as an alternative approach to reducing the deleterious effects of T1 decay during the acquisition. Reordered phase encoding can provide an improved point spread function and a substantial increase in the CNRs as disclosed in Mugler III J. P., Spraggins T. A. Improving Image Quality in Snapshot FLASH and 3D MP RAGE Sequences by Employing Reordered Phase Encoding. "Works-in-Progress" Society of Magnetic Resonance in Medicine, 9th Annual Meeting, 1310, 1990.

The straight forward application of the snapshot FLASH technique to a one-shot 3D acquisition results in a measuring time of only a few seconds for a complete 3D data set as disclosed in Henrich D., Haase A., Matthaei D. Fast Three-Dimensional Snapshot FLASH MR Studies. Radiology 173(P), 289, 1989 (abstract). The multi-shot 3D approach, of the instant invention, known as 3D MP RAGE as disclosed in Mugler III J. P., Brookeman J. R. Three-Dimensional Magnetization-Prepared Rapid Gradient-Echo Imaging (3D MP RAGE). Magn Reson Med 15, (152–157), 1990, has produced high-contrast, high-resolution 3D image sets in a period of several minutes.

Generalizing and extending the work of Haase et al on snap-shot FLASH to the general three dimensional case presented several problems. For example, due to the structure and complexity of our technique, 3D MP RAGE, the contrast behavior of the images displays a complicated dependence on many sequence parameters. The snapshot FLASH technique which employs repetition times for the gradient-echo sequence on the order of 5 ms or less and flip angles of 5° or less, was designed to acquire an image or images very rapidly in comparison to existing routine clinical techniques. The snapshot FLASH technique is disclosed in Haase A., Matthaei D., Bartkowski R., et al. Inversion Recovery Snapshot FLASH MR Imaging, J Comput Assist Tomogr 13, 1036–1040, 1989. Haase A. Snapshot FLASH MRI, and Applications to T1, T2, and Chemical-Shift Imaging. Magn Reson Med 13, 77–89, 1990. The original published work demonstrated $64 \times 128$ images acquired in approximately 200 ms. As presented by Haase, the combination of the very short acquisition time and the minimal effect of a series of very low flip angle pulses on the longitudinal magnetization allowed the snapshot FLASH technique to be used in combination with specific contrast preparations and yield meaningful imaging results. It is noted that the experimental work of Haase was performed on a 40 cm. bore 4.7 Tesla imager, that is, a nonclinical machine.

When the snapshot FLASH technique was implemented on whole-body machines, results similar to those demonstrated by Haase were obtained, as disclosed in Kiefer B., Deimling M., Finelli D. Ultrafast Measurement of T1- and T2-weighted Images with "SNA. P.SHOT"-FLASH. Book of Abstracts, 8th Annual Meeting of the Society of Magnetic Resonance in Medicine, 1989, p 367. However, due to the very low flip angles and to the high sampling bandwidth secondary to the very short repetition time, the signal to noise ratios per volume of these images were very low compared to those for the spin-echo or gradient-echo techniques routinely employed in clinical imaging. If the sequence were simply repeated, as in a direct transformation to a 3D multi-shot implementation, some improvement in the signal-to-noise would of course result due to the second phase-encoding direction. However the contrast properties would be greatly affected due to the repeated application of the preparation and acquisition, and for more than a very few cycles the advantage of a very short total scan time would be lost. The short scan time was the primary impetus behind the magnetization prepared snapshot FLASH technique. Thus, it appeared that the potential role of the magnetization prepared snapshot FLASH technique was imaging moving structures or dynamic processes with relatively high temporal resolution and freely controllable image contrast. It was not obvious that some sort of extension to a multi-shot three-dimensional imaging strategy would yield results of any particular value.

One of the important modifications introduced in developing our technique 3D MP RAGE, was to employ significantly longer repetition times and larger flip angles. One specific purpose of the longer repetition time is to allow data sampling with a substantially decreased bandwidth as compared to the snapshot FLASH sequence. Although it is well known that taken separately decreased bandwidths and increased flip angles would be applicable for increased signal-to-noise ratios, the effectiveness of such an approach in this case was not obvious because of the problems that would accompany such modifications. Specifically, a significantly longer repetition time would in turn significantly lengthen the period of data acquisition, allowing relaxation to play a major role in the measured signals. Thus the signal strengths would depend on the phase-encoding step and assumably result in undesirable image degradation. In addition, larger flip angles would result in the data acquisition having a significant affect on evolution of the magnetization. This process would introduce further variations in the signal strength as a function of the phase-encoding step, presumably leading to additional image degradation. It has now been discovered that longer repetition times and larger flip angles could be successfully employed if the sequence structure was properly designed. By "successfully employed", is meant that only minimal image degradation results. It been further discovered that such a structure could be used to produce three dimensional image sets of sufficient image quality to be useful in routine clinical evaluations.

The 3D MP RAGE technique differs philosophically from snapshot FLASH in that 3D MP RAGE was designed to acquire image data with high spatial resolution, high signal-to-noise, but low temporal resolution where snapshot FLASH was designed to trade signal-to-noise and spatial resolution for very high temporal resolution. In addition, in developing 3D MP RAGE we violated the basic precepts of snapshot FLASH, namely the ultrashort repetition times and very low flip angles.

T1 contrast

As is well known from both NMR spectroscopy and MRI, a 180° inversion pulse followed by a time delay is an effective preparation for developing T1-dependent contrast. However, depending on the overall sequence timing and constraints, and the tissue properties, flip angles other than 180° may provide optimum SNR and/or CNR. A T1 preparation is implemented which consists of an $\alpha°$ pulse $0 < \alpha° < 180$) followed by a time delay. If the delay is short compared to T2 values of interest, spoiling gradients are applied during the delay period to eliminate or minimize image artifacts from residual transverse magnetization.

T2 contrast

A 90°-delay-180°-delay-90° preparation can encode T2 contrast in the form of longitudinal magnetization. Depending on the relative phases of the pulses, the encoded magnetization can be placed along the positive z-axis (i.e., a driven equilibrium preparation as in the DEFT technique from NMR spectroscopy as disclosed in Becker E. D., Ferretti J. A., Farrar T. C. Driven Equilibrium Fourier Transform Spectroscopy. A New Method for Nuclear Magnetic Resonance Signal Enhancement. J Am Chem Soc 91, 7784–7785, 1969) or the negative z-axis (i.e., a driven inversion preparation as disclosed in Conturo T. E., Beth A. H., Kessler R. M., et al. Cooperative T1 and T2 Effects on Contrast and T2 Sensitivity with Improved Signal to Noise Using a New Driven Inversion Spin Echo (DISE) Sequence. "Book of Abstracts", Society of Magnetic Resonance in Medicine, 6th Annual Meeting, 807, 1987). Considering in-vivo tissue T1 relaxation times, typical whole-body MRI gradient performance characteristics, and the resolution requirements for clinical imaging, the image acquisition period may be comparable to some of the tissue T1 values. Thus, depending on the amount of image data acquired during a given sequence cycle, the starting position (+z versus −z) for the encoded magnetization can significantly affect the resulting image contrast. The amount of data acquired per cycle is dependent on the required total imaging time and the desired image resolution. Since the T1 and T2 values are usually correlated, the T1 decay during the image acquisition period opposes the T2 contrast developed by the contrast preparation if the encoded magnetization is placed along the positive z-axis. However, if the encoded magnetization is placed along the negative z-axis, the T1 decay during acquisition adds to the prepared T2 contrast (assuming $M_z<0$).

Mixed contrast

As discussed in the preceding paragraph, the inherent sensitivity of the 3D MP RAGE technique to T1 decay can present problems when the goal is to produce T2-dependent contrast in the image. For certain imaging goals however, such as increased conspicuity of liver metastases, it may be desirable to intentionally combine the T1 and T2 contrast in the preparation. This is easily achieved by inserting a variable delay period between the second 90° pulse of the T2 preparation and the start of the gradient-echo acquisition.

Later in the sequence development, other magnetization preparations such as chemical species specific saturation may also be investigated.

The image acquisition period

The image data is acquired using a short-TR gradient-echo sequence. This sequence may be any one of the standard gradient-echo techniques such as FLASH, FFE, GRASS, FAST or FISP, or some variant of these sequences as described below. One of the important and interesting features of a 3D MP RAGE sequence is that the image data is acquired during a T1-dependent transient. As a result, the configuration of the gradient-echo acquisition is critical in determining the image properties. The T1 decay during acquisition not only modifies the signal and contrast state defined by the magnetization preparation, but also results in a T1-dependent point spread function (PSF) in the phase-encoding direction corresponding to the rapid acquisition. (If a gradient rephased sequence is employed for acquisition, the signal transient and PSF also depend on T2). Thus, it is important to explicitly account for the phase-encoding process in the theoretical calculations. Since the major structure of the image is determined by the values of the low spatial frequency components, we calculate the signal levels for given tissues based on the value of the zero spatial frequency component. The variations in the spatial frequency component values with respect to zero spatial frequency define a filter function used to calculate the tissue specific PSF. The image resolution in the corresponding direction can be corrected for the effects of this PSF. Of course, the image acquisition period per cycle can be made very short to minimize these problems, but as the amount of data collected per cycle decreases so does the advantage of 3D MP RAGE over standard three-dimensional imaging techniques such as 3D FLASH. In addition, if less than a complete plane of spatial frequency space is sampled during a given sequence cycle, discontinuities may exist in the spatial frequency filter function, depending on the details of the spatial frequency sampling. Specific acquisition sequence parameters that should be included in the model of the acquisition sequence are as follows:

TR, TE, $T_s$

The sequence repetition time (TR), echo time (TE), and data sampling period ($T_s$) are the basic timing parameters for the gradient-echo acquisition. Since the TR is of necessity required to be short (somewhere between the hardware minimum based on the required resolution and about 20 ms), a small change in TR may translate into a large fractional change in the data sampling period and hence a significant change in the noise contribution to the image.

Flip angle

The choice of the flip angle for the RF excitation pulse in the gradient-echo sequence represents a trade-off between increasing the signal strength corresponding to a given phase-encoding step and increasing the effects of the acquisition on the relaxing magnetization. The employment of a constant flip angle for the acquisition, as disclosed in Mugler III J. P., Brookeman J. R., may not yield optimum results in all situations. Three-Dimensional Magnetization-Prepared Rapid Gradient-Echo Imaging (3D MP RAGE). Magn Reson Med 15, (152–157), 1990. The theoretical model includes a flip angle that is variable as a function of the phase-encoding step. By proper choice of the flip angle values, the shape of the tissue dependent PSF can be controlled. In optimizing the sequence we would try to derive a flip angle combination that would provide well-behaved (i.e., real, symmetric, relatively low amplitude sidelobes) PSFs and at the same time minimize the net effect of the acquisition on the relaxing magnetization within the CNR and resolution constraints. We note that a TR dependent on the phase-encoding step may also be important for achieving this goal.

Phase-encoding order

The order of the phase-encoding is critical in determining the contrast properties of the image. Various phase-encoding schemes have been successfully employed in previous MR techniques such as respiratory ordered phase encoding as disclosed in Bailes D. R., Gilderdale D. J., Bydder G. M., et al. Respiratory Ordered Phase Encoding (ROPE): A Method for Reducing Respiratory Motion Artefacts in MR Imaging. J Comput Assist Tomogr 9, 835–838, 1985 and RARE imaging. The modification of the phase-encoding order to improve the characteristics of the point spread function and provide access to a wider range of image contrast properties is discussed in Mugler III J. P., Spraggins T. A.. Improving Image Quality in Snapshot FLASH and 3D MP RAGE Sequences by Employing Reordered Phase Encoding. "Works-in-Progess" Society of Magnetic Resonance in Medicine, 9th Annual Meeting, 1310, 1990.

The magnetization recovery period The recovery period provides an additional degree of freedom for controlling the image contrast by providing additional time for T1 and T2 relaxation before the start of the next sequence cycle. The duration of the recovery period is determined by the desired contrast properties of the image, the T1 relaxation properties of the tissues, and the state of the longitudinal magnetization at the end of the gradient-echo acquisition. The two limiting cases for the magnetization recovery period are zero duration and a duration which is relatively long compared to the T1s of interest. The second case, that of a relatively long recovery period, is particularly interesting since in this case a given preparation-acquisition-recovery cycle is decoupled from other cycles, and relative variations in the recovery periods would therefore not adversely affect the image quality.

2. Optimization of Pulse Sequence Parameters

As one can seen from the outline of the theoretical model, numerous parameters combine to determine the image SNR and CNR behavior in 3D MP RAGE sequences. (Even for the very simple case of an inversion recovery preparation, fixed flip angle acquisition, and a specific phase-encoding scheme, there are 6 variables.) In addition, many of the parameters are coupled and constrained based on requirements on the total imaging time, minimum resolution, maximum chemical shift artifact, and so on. Some imaging applications require only simple optimization goals such as maximizing the SNR from a single tissue, or the CNR for a single tissue pair, subject to the other imaging requirements and constraints. However, given the complexity of the human body, such simple requirements are not always sufficient. For example, a very reasonable goal would be to maximize the CNR for one tissue pair while minimizing the signal from one or more other tissues. Thus, it will be necessary for the optimization technique to search for maxima or minima based on multiple, possibly interrelated goals. For the situation described, optimization by global search would be far too time consuming. The routine employed must handle a multidimensional, nonlinear, constrained optimization and complicated goal functions. Traditional optimization strategies such as direction-set methods or conjugate gradient methods, are not suited to this type of problem are disclosed in Brent R. P. Algorithms for Minimization without Derivatives, Prentice-Hall, Englewood Cliffs, N.J., 1973 and Jacobs DAH, ed. The State of the Art in Numerical Analysis, Academic Press, London, 1977.

3. Comparison with Existing 3D Imaging Techniques

Advantages of the 3D MP RAGE technique include:

1. In initial imaging studies, 3D MP RAGE appears to deliver significant increases in the contrast-to-noise ratio per unit time for certain imaging situations (e.g., T1-weighted brain imaging).

2. The use of a separate magnetization preparation period allows the selection of the image contrast to be largely separated from the image data acquisition. In addition, certain tissue contrast properties can be obtained in a much shorter imaging time than is possible with existing steady-state acquisition schemes.

3. The cyclic nature of the sequence makes it naturally applicable to imaging structures subject to periodic motion such as the liver or heart by applying a respiratory or cardiac trigger to the preparation - acquisition - relaxation cycle.

4. The dead times in the magnetization preparation and/or recovery periods can be used for secondary magnetization preparations such as spatial or chemical presaturation.

5. In certain configurations of the sequence, the 3D image set shows ghosting artifacts from cardiac and respiratory motion only in one phase-encoding direction, not two phase-encoding directions as is common for existing 3D imaging techniques.

4. Specific contributions for the 3D MP RAGE technique.

1. Reduction of patient imaging times and examination costs. Current imaging times for brain studies at our institution range from 30 to 45 minutes. Often, it is necessary to repeat a specific type of sequence (e.g., T1 weighted) in multiple planes to obtain the desired anatomical views. If a high-resolution 3D volume set were available, any arbitrary view could be obtained by post-processing the image data. With the preliminary versions of our new technique, we can acquire 128 T1-weighted, thin contiguous slices spanning the whole head in only 6 minutes. From this set, we have obtained images in various orientations (including oblique and double oblique) using post-processing software built into our commercial imager. Thus, a single 3D MP RAGE acquisition could be employed as a general screening sequence to replace two or more conventional acquisitions, reducing the imaging time for applicable studies and therefore making these studies more tolerable for the patients. In addition, since decreased imaging times can be translated into increased patient throughput, this could potentially result in a decrease in examination costs.

2. Surgical Planning. It is well known that multi-planar images, such as those generated by CT or MRI, can be utilized to produce volume reconstructions for surgical planning. For optimum results, a 3D data set of the complete region of interest with relatively high resolution is needed. The acquisition time for such 3D MRI data sets is typically 10 to 20 minutes using existing pulse sequence techniques. Considering that the resolution in such images is on the order of 1 mm or less, it is often difficult for the patient to remain sufficiently still during the examination. In addition, with an imaging time of up to 20 minutes, this type of sequence may be considered too long to be an add-on to a standard MRI exam and may therefore necessitate the time and expense of a separate study. The 3D MP RAGE sequence, which can acquire a high-contrast, high-resolution 3D data set in only 6 minutes, is short enough to be used as an add-on to a standard examination. Thus, it should be viable to acquire the data necessary for surgical planning on a routine basis.

Three-Dimensional Abdominal Imaging

The basic acquisition structure of 3D MP RAGE makes it inherently applicable to imaging structures subject to periodic motion such as the liver. In preliminary studies, we have acquired high-quality 3D data sets which span the entire abdomen. The images show only minimal respiratory artifacts. The acquisition of a 3D data set with only minimal motion artifacts is possible because the actual data acquisition occurs only at end expiration, when the abdomen is relatively still, and the remainder of the respiratory period is used for contrast preparation and magnetization recovery. This technique can produce 3D image sets of the abdomen with minimal respiratory artifacts in an imaging period acceptable for routine clinical use.

EXAMPLE I

Imaging was performed on a standard whole-body imager operating at a field strength of 1.5T (Siemens Magnetom 63SP, Siemens Medical Systems, Iselin, N.J.). FIG. 3 shows images from a 3D MP RAGE acquisition through the abdomen of a normal volunteer in the sagittal orientation. The image matrix was 128 (350 mm) by 128 (350 mm) by 256 (700 mm). This yields cubic voxels 2.7 mm on a side. The total imaging time was 7.18 min. The magnetization preparation consisted of an inversion pulse followed by a 350 ms delay which produced strong T1 weighting in the image. Each RAGE acquisition acquired 128 lines in 1024 ms (TR/TE 8/3.3, FLASH type sequence, 10° flip angle) and was performed at end expiration. The recovery period was 2 s. Respiratory triggering was not used and instead, the subject voluntarily respired in synchrony with the sequence. FIGS. 3b-3d show coronal (b and c) and transverse (d) images reformatted from the original sagittal acquisition. Since each RAGE acquisition was only 1 s, image artifacts from stomach, bowel, and cardiac motions appear predominantly in one phase-encoding direction (horizontal in FIG. 3a). Note the sharp definition of the upper edge of the liver in FIGS. 3a-3c. Examination of the anterior subcutaneous fat in FIGS. 3a and 3d reveals only minor artifacts from respiration. Note the relatively black appearance of flowing blood as seen in FIG. 3c. This feature may prove very valuable in relation to studies of vessels diseased with atherosclerosis.

EXAMPLE II

FIG. 4 shows images from a 3D MP RAGE acquisition of the head of a normal volunteer acquired in the sagittal orientation. The image matrix was 128 (180 mm) by 128 (250 mm) by 256 (250 mm), interpolated to 128×256×256. This yields voxels with dimensions of 1.4 by 1.0 (interpolated) by 1.0 mm. The total imaging time was 5.92 min. The magnetization preparation consisted of an inversion pulse followed by a 500 ms delay which produced strong T1 weighting in the image. Each RAGE acquisition acquired 128 lines in 1280 ms (TR/TE 10/4.15, FLASH type sequence, 10° flip angle). The recovery period was 1 s. FIGS. 4b-4d show coronal (b and c) and transverse (d) images reformatted from the original sagittal acquisition. The images display excellent gray/white contrast compared to the standard T1-dependent imaging sequences we currently employ (400/15 2D spin echo and 30/5 3D FLASH). Due to the very short TE of the RAGE acquisition and the small voxel sizes, the images do not show any significant susceptibility artifacts at air/soft tissue and bone/soft tissue interfaces. In FIG. 4c, note the bright appearance of the blood in the arteries surrounding the pituitary. During the 500 ms delay period, fully magnetized blood flows into the transmit/receive head coil resulting in an inflow enhancement effect for the arteries. Blood that experiences the inversion pulse, such as that in the venous structures, appears dark in the images.

EXAMPLE III

FIG. 5 shows transverse T1-weighed head images (2 mm thick) of a normal volunteer from a 3D set of 32 slices. The total acquisition time was 1.1 minutes. (preparation: 90° pulse followed by a 140 ms delay; acquisition: FLASH sequence with TR/TE/Flip 12/5/15°, matrix 32×128×256, FOV 250 mm, add sequential phase encoding; recovery: none)

EXAMPLE IV

FIG. 6 shows transverse T2-weighted head images (2 mm thick) of a normal volunteer from a 3D set of 32 slices. The total acquisition time was 4.3 minutes (preparation: driven equilibrium (90°-180°-90°) with an echo time of 56 ms followed by a 42 ms delay for spoiling; acquisition: FISP sequence with TR/TE/Flip 14/5/10°, matrix 32×128×256, FOV 250 mm, centrally reordered phase encoding in the slice select direction; recovery: 1454 ms).

GLOSSARY

2D: Two-dimensional

3D: Three-dimensional

3D MP RAGE: Three-Dimensional Magnetization-Prepared Rapid Gradient Echo. The MRI pulse sequence technique which is the subject of this invention.

CSF: Cerebrospinal fluid.

Contrast: The difference in signal intensity from two tissues, sometimes scaled to a reference intensity value.

Contrast-to-noise ratio: The difference in signal intensity from two tissues, scaled by a measure of the random noise signal in the image. The contrast-to-noise ratio provides an indication of how well the tissues can be distinguished from each other. CNR: Contrast-to-noise ratio.

Excitation: In a general sense, the delivery of energy into the spin system using a radio-frequency pulse. An RF pulse whose purpose is to produce transverse magnetization that can later be measured is commonly referred to as an excitation pulse.

Echo-Planar: Disclosed in Mansfield P. Multi-Planar Image Formation Using NMR Spin Echos, Journal Phys Chem 10, L55, 1977, Stehling M. K., Ordidge R. J., Coxon R., et al, Ultra-High-Speed Inversion Recovery Echo Planar MR Imaging: Technique and Application, and Radiology 169(P), 377, 1988 (abstract), and Stehling M. K., Ordidge R. J., Coxon R., Mansfield P. Inversion-Recovery Echo-Planar Imaging (IR-EPI) at 0.5T. Magn Reson Med 13, 514–517, 1990.

FAST: Fourier Acquired Steady state. See fast imaging with steady precession. Gyngell M. L. The Application of Steady-State Free Precession in Rapid 2DFT NMR Imaging: FAST and CE-FAST Sequences. Magn Reson Imaging 6, 415–419, 1988.

Fast imaging with steady precession: A short-TR partial flip angle gradient-echo pulse sequence that employs a steady-state of the complete magnetization vector. That is, the gradient structure of the sequence is balanced such that a spin group at any given fixed physical position experiences the same precession angle history with each sequence repetition.

Fast low-angle shot: A short-TR partial flip angle gradient-echo pulse sequence that employs a steady-state of the longitudinal component of the magnetization vector. That is, the transverse magnetization introduced by a given excitation pulse (ideally) contributes only to the echo signal immediately following the pulse. Often, some type of spoiling is employed in this type of sequence to reduce or eliminate potential artifacts from residual transverse magnetization.

FFE: Fast Field Echo. See fast low-angle shot. van der Meulen P., Groen J. P., Cuppen J. J. M. Very Fast MR Imaging by Field Echoes and Small Angle Excitation. Magn Reson Imaging 3, 297–299, 1985.

FISP: Fast Imaging with Steady Precession.

FLASH: Fast Low-Angle Shot. Haase A., Frahm J., Matthaei D., et al. FLASH Imaging. Rapid NMR Imaging Using Low Flip-Angle Pulses. J Magn Reson 67, 258–266, 1986.

Flip angle: The angle of rotation of the magnetization vector produced by an RF pulse. The angle is measured with respect to the longitudinal axis, the direction parallel to the main magnetic field.

Gd-DTPA: A commonly used paramagnetic MRI contrast agent (chelated gadolinium) that is employed to reduce T1 relaxation times for increased lesion conspicuity.

Gradient echo: A refocusing of phase coherence among spin isochromats at different positions along the magnetic field gradient resulting from (1) balanced negative and positive gradient pulses, or (2) balanced gradient pulses of the same sign on opposite sides of an RF pulse. A gradient echo does not refocus phase shifts due to static field inhomogeneities, susceptibility differences or chemical shift.

Gradient pulse: A briefly applied magnetic field gradient.

GRASS: Gradient Recalled Acquisition in Steady State. See fast imaging with steady precession. Utz J. A., Herfkens R. J., Glover G., Pelc N. Three Second Clinical NMR Images Using a Gradient Recalled Acquisition in a Steady State Mode (GRASS). Magn Reson Imaging 4, 106, 1986 (abstract).

Hybrid: Haacke E. M., Bearden F. H., Clayton J. R., Linga N. R. Reduction of MR Imaging Time by the Hybrid Fast-Scan Technique. Radiology 158, 521–529, 1986.

Inversion: A non-equilibrium state in which the magnetization vector is anti-parallel to the direction of the main magnetic field (i.e. along the $-z$ axis). An inversion pulse is a 180° RF pulse which rotates the longitudinal component of the magnetization vector from the $+z$ axis to the $-z$ axis.

k-space volume: The magnetic resonance spatial frequency data set which defines the acquired image.

Longitudinal component of the magnetization vector: The projection of the magnetization vector onto an axis parallel to the direction of the main magnetic field. The longitudinal axis is generally referred to as the z-axis.

Longitudinal magnetization: The longitudinal component of the magnetization vector.

Longitudinal relaxation: The process by which the longitudinal component of the magnetization vector relaxes to its thermal equilibrium value aligned with the main magnetic field. The relaxation takes place with a characteristic time constant T1. Low flip angle: A flip angle less than 90°.

Magnetic field gradient: A magnetic field whose strength varies with position. Generally, linear gradients are used for MRI.

Magnetization preparation (MP) period: In an MP RAGE sequence, the period preceding data acquisition in which a series of RF pulses, gradient pulses, and time delays are applied to encode the desired contrast properties in the form of longitudinal magnetization. The term is employed herein to generically include pulse sequence techniques, such as snapshot FLASH imaging. When this preparation is applied to the object of interest, differences are developed in the amplitude and/or phase of the magnetization vector based on the tissue properties. Since the prepared contrast is subsequently sampled by the rapid gradient-echo sequence, the tissue dependent differences in the magnetization vector must be generated as, or converted to, differences in the longitudinal component of the magnetization vector.

Magnetization recovery period: In an MP RAGE sequence, the period following data acquisition which allows T1 and T2 relaxation before the start of the next sequence cycle.

Magnetization vector: The net magnetic moment resulting from a group of spins.

Matrix size: Specifies the number of data points along each dimension in the digital image or volume image set. For example, a 2D image might be specified as $128 \times 256$, and a 3D image set might be specified as $128 \times 128 \times 128$, or equivalently $128^3$.

Motion artifacts: A misregistration of signal from tissues which move during the acquisition of the image data. Common sources of motion artifacts include respiratory motion, cardiac motion, blood flow, eye movement, swallowing, and voluntary motion.

MP RAGE: Magnetization Prepared Rapid Gradient Echo.

MRI: Magnetic Resonance Imaging.

ms: milliseconds.

Multi-slice: Refers to 2D imaging techniques which acquire more than one image slice at a time, usually by interleaving (in time) several slice acquisitions within TR.

Partial flip angle: A flip angle less than 90°.

Phase-encoding: The process of encoding the spatial position by applying a position dependent phase shift to the spin system before signal acquisition. The phase shift is incremented linearly with each sequence repetition.

Point spread function: The inverse Fourier transform of the filter function in the spatial frequency domain.

Proton density: The quantity of signal producing protons in a given volume divided by the volume.

PSF: Point Spread Function.

Pulse sequence: A combination of RF pulses, gradient pulses, and time delays designed to produce images with specific contrast properties.

RAGE: A generic acronym for rapid gradient echo, and referring to an acquisition period which is relatively short compared to the T1 values of interest.

Rapid acquisition with relaxation enhancement: A rapid imaging technique that employs repeated spin echoes with different phase-encodings to collect a complete image with only one or a few excitation pulses.

RARE: Rapid Acquisition with Relaxation Enhancement. Hennig J., Nauerth A., Friedburg H. RARE Imaging: A Fast Imaging Method for Clinical MR. Magn Reson Med 3, 823–833, 1986.

RF: radio frequency.

RF pulse: A brief application of RF energy.

Signal-to-noise ratio: The ratio of the signal intensity from a tissue to a measure of the random noise level in the image.

Slice profile: The spatial distribution of the relative signal contributions to a given image intensity value measured along the direction perpendicular to the plane of the slice.

SNR: Signal-to-Noise Ratio.

Snapshot FLASH imaging: Haase et al (Haase A., Matthaei D., Bartkowski R., et al. Inversion Recovery Snapshot FLASH MR Imaging. J Comput Assist Tomogr 13, 1036–1040, 1989. Haase A. Snapshot FLASH MRI. Applications to T1, T2, and Chemical-Shift Imaging. Magn Reson Med 13, 77–89, 1990.

Spatial frequency space: Physical coordinate space (the spatial domain) and spatial frequency space (the spatial frequency domain) are related via the Fourier transform. Since the MR imaging process physically performs a Fourier transform on the spin system, the signal that is measured during the MRI experiment represents the spatial frequency components corresponding to the desired image.

Spin echo: A refocusing of phase coherence among spin isochromats resulting from the application of two RF pulses. The echo occurs such that the time between the two RF pulses equals the time between the second RF pulse and the echo. A spin echo refocuses phase shifts due to static field inhomogeneities, susceptibility differences, and chemical shift.

Spin isochromat: A macroscopically small group of spins that all experience the same magnetic field strength.

Spoiling: The application of additional gradient pulses or RF phase shifts in an attempt to destroy the phase coherence of the transverse magnetization before the succeeding excitation pulse.

Steady state: Sequences which are based on either a steady state of the longitudinal component of the magnetization (e.g., standard spin-echo or FLASH) or a steady state of the complete magnetization vector (e.g., FISP or GRASS).

T1: The spin-lattice or longitudinal relaxation time. See longitudinal relaxation.

T1-weighted: Refers to image contrast which displays a relatively strong dependence on the tissue T1 values.

T2: The spin-spin or transverse relaxation time. See transverse relaxation.

T2-weighted: Refers to image contrast which displays a relatively strong dependence on the tissue T2 values.

Temporal event: An event such as a patient's respiration or heart beat.

TE: Echo time for the pulse sequence.

TR: Repetition time for the pulse sequence.

Transverse component of the magnetization vector: The projection of the magnetization vector onto a plane perpendicular to the direction of the main magnetic field. The transverse plane contains the x and y axes.

Transverse magnetization: The transverse component of the magnetization vector.

Transverse relaxation: The process by which the transverse component of the magnetization vector relaxes to its thermal equilibrium value of zero. The relaxation takes place with a characteristic time constant T2.

Truncation artifacts: Image artifacts which are sometimes apparent at rapid transitions in signal intensity. These artifacts appear when the image acquisition does not acquire a sufficient range of spatial frequency values to adequately describe the given spatial distribution of intensities.

Voxel: Volume element. The volume which corresponds to a given discrete intensity value in the image.

What is claimed is:

1. In a method for producing a set of magnetic resonance three-dimensional image data, a preparation-acquisition-recovery pulse sequence cycle comprising the steps of:
   a—a magnetization preparation period in which a series of at least one of RF pulses, gradient field pulses, and time delays are applied to encode the desired contrast properties in the form of longitudinal magnetization,
   b—a data acquisition period, said data acquisition period including at least two repetitions of a gradient echo sequence to acquire data for a fraction of k-space,
   c—a magnetization recovery period which allows T1 and T2 relaxation before the start of the next sequence cycle, and
   d—repeating steps a, b and c until a predetermined k-space volume is sampled.

2. The method of claim 1, wherein at least some of said RF pulses are spatially or chemically non-selective.

3. The method of claim 1, wherein at least some of the preparation-acquisition-recovery sequences cycles are initiated by a trigger signal, whereby said sequence is synchronized with an external temporal event.

4. The method of claim 1, wherein said magnetization recovery period has a time of zero.

5. The method of claim 1, wherein at least some of said RF pulses and/or gradient pulses applied during at least one of steps (a), (b), and (c) stabilize responses of the apparatus.

6. The method of claim 1, wherein at least some of said RF pulses and/or gradient pulses applied during at least one of steps (a), (b), and (c) stabilize the magnetization system.

7. The method of claim 5, wherein eddy currents are stabilized.

8. The method of claim 6, wherein there is a stabilization of oscillations in signal strength.

9. The method of claim 1, wherein more than one contrast property is encoded by the magnetization preparation step.

10. The method of claim 1, wherein the duration of at least one step, of steps a, b, and/or c is constant.

11. The method of claim 1, wherein the duration of at least one of steps a, b, and c, varies from sequence cycle to cycle.

12. The method of claim 1, wherein at least some of said RF pulses are at least spatially or chemically selective.

13. The method of claim 12 wherein at least some of said RF pulses are spatially and chemically selective.

14. The method of claim 12 wherein at least some of said RF pulses of at least one of steps a, b, and c, are spatially selective in at least two dimensions.

15. The method of claim 1, wherein said gradient-echo sequence employs at least one of gradient or RF spoiling whereby the effects of residual transverse coherences are reduced or eliminated.

16. The method of claim 1, wherein said gradient-echo sequence employs at least a partially rephased gradient structure.

17. The method of claim 16 wherein said gradient-echo sequence employs a fully rephased gradient structure.

18. The method of claim 1, wherein said gradient-echo sequence employs flip angles which are constant.

19. The method of claim 1, wherein said gradient-echo sequence employs flip angles which vary within a given data acquisition period.

20. The method of claim 1, wherein said gradient-echo sequence employs flip angles which vary between data acquisition periods.

21. The method of claim 1, wherein said gradient-echo sequence employs flip angles which vary both within and between data acquisition periods.

22. The method of claim 1, wherein said gradient-echo sequence employs a repetition time which is constant.

23. The method of claim 1, wherein said gradient-echo sequence employs a repetition time which varies within a given data acquisition period.

24. The method of claim 1, wherein said gradient-echo sequence employs a repetition time which varies between data acquisition periods.

25. The method of claim 1, wherein said gradient-echo sequence employs a repetition time which varies both within and between data acquisition periods.

26. The method of claim 1, wherein said gradient-echo sequence employs an echo time which is selected from the group consisting of constant, varying within a given data acquisition period, varying between data acquisition period, and varying both within and between data acquisition periods.

27. The method of claim 1, wherein said gradient-echo sequence employs a data sampling period which is constant, or which varies within a given data acquisition period, or which varies between data acquisition periods, or which varies both within and between data acquisition periods.

28. The method of claim 1, wherein said gradient-echo sequence employs one of symmetric sampling of the echo and asymmetric sampling of the echo thereby potentially acquiring only a half echo.

29. The method of claim 1, wherein said gradient-echo sequence acquires the signal in the presence of a single constant applied gradient, and the remaining spatial dimensions are phase-encoded.

30. The method of claim 1, wherein said gradient echo sequence acquires a plane, or a fraction of a plane, of k-space data each sequence cycle.

31. The method of claim 1, wherein said k-space data collected by said gradient-echo sequence during a given sequence cycle is not contained in any plane.

32. The method of claim 1, wherein the temporal order in which the k-space data is collected for each sequence cycle is determined based on achieving selected properties in the image.

33. The method of claim 1, wherein the temporal order in which the k-space data is collected for each sequence cycle is determined based on achieving selected contrast properties in said image.

34. The method of claim 1, wherein the temporal order in which the k-space data is collected for each sequence cycle is determined based on achieving selected properties of the corresponding point spread function.

35. The method of claim 1, wherein the temporal order of k-space data collection is fixed.

36. The method of claim 1, wherein the temporal order of k-space data collection varies from sequence cycle to cycle.

37. The method of claim 1, wherein said gradient-echo sequence acquires a fixed amount of k-space data during each sequence cycle.

38. The method of claim 1, wherein said gradient-echo sequence acquires a varying amount of k-space data during each sequence cycle.

39. The method of claim 1, wherein said gradient-echo sequence acquires said data in the presence of at least two constant applied gradients, and any remaining spatial dimensions, employ phase encoding.

40. The method of claim 1, wherein said gradient-echo sequence acquires said data in the presence of from one to three time-varying applied gradients, and any remaining spatial dimensions employ phase encoding.

41. The method of claim 1, therein said gradient-echo sequence employs predetermined gradient waveforms to compensate in the sampled signal for phase shifts due to at least one of flow or motion.

42. The method of claim 41, wherein said compensations are specifically designed for at least one of velocity, acceleration and higher orders of motion.

43. The method of claim 1, wherein in step (b) there is employed data acquisition in the absence of any applied magnetic field gradients and from two to three spatial dimensions are encoded using phase-encoding, whereby, one dimension of the three or four dimensional data set contains chemical shift information.

44. The method of claim 1, wherein said time period employed for magnetization recovery is also employed for magnetization preparation.

* * * * *

(12) EX PARTE REEXAMINATION CERTIFICATE (7476th)
United States Patent
Mugler, III et al.

(10) Number: US 5,245,282 C1
(45) Certificate Issued: May 4, 2010

(54) THREE-DIMENSIONAL MAGNETIC RESONANCE IMAGING

(75) Inventors: John P. Mugler, III, Charlottesville, VA (US); James R. Brookeman, Charlottesville, VA (US)

(73) Assignee: University of Virginia Patent Foundation, Charlottesville, VA (US)

Reexamination Request:
No. 90/010,453, Mar. 13, 2009

Reexamination Certificate for:
Patent No.: 5,245,282
Issued: Sep. 14, 1993
Appl. No.: 07/723,230
Filed: Jun. 28, 1991

(51) Int. Cl.
*G01V 3/00* (2006.01)

(52) U.S. Cl. .................................................. 324/309
(58) Field of Classification Search ..................... None
See application file for complete search history.

(56) References Cited

U.S. PATENT DOCUMENTS

| | | | |
|---|---|---|---|
| 4,707,658 | A | 11/1987 | Frahm et al. |
| 4,742,301 | A | 5/1988 | van der Meulen et al. |
| 4,770,182 | A | 9/1988 | Damadian et al. |
| 4,851,779 | A | 7/1989 | DeMeester et al. |

OTHER PUBLICATIONS

U. Böttcher et al., Sequential Inversion recovery Snapshot–FLASH 8(S1) Magnetic Resonance Imaging, SMRI Eight Annual Meeting Program and Abstracts, Feb. 1990, at 16 (1990).

Robert R. Edelman et al., Segmented TurboFLASH: Method for Breath–Hold MR Imaging of the Liver With Flexible Contrast, 177 Radiology 515 (1990).

Robert R. Edelman et al., Breath–Hold Abdominal STIR and T2–Weighted Imaging Using an Interleaved Ultra–Fast Gradient–Echo Sequence, 8(S1) Magnetic Resonance Imaging, SMRI Eight Annual Meeting Program and Abstracts, Feb. 1990, at 35.

Jens Frahm et al., Rapid Three–Dimensional MR Imaging Using the Flash Technique, 10(2) Journal of Computer Assisted Tomography 363 (1986).

A. Haase et al., Flash Imaging. Rapid NMR Imaging Using Low Flip–Angle Pulses, 67 Journal of Magnetic Resonance 258 (1986).

Dietmar Henrich et al., Fast Three–Dimensional Snapshot Flash MR Studies, 173(P) Radiology, RSNA '89 Scientific Program, 1989, at 289.

E. de Lange et al., Magnetization–Prepared Rapid Gradient Echo (MP–Rage) Magnetic Resonance Imaging of Morgagni's Hernia, 11 European Journal of Radiology 196 (1990).

(Continued)

*Primary Examiner*—Colin M LaRose

(57) ABSTRACT

A new three-dimensional (3D) MR imaging pulse sequence can produce over 100 high-resolution, high-contrast images in as little as 6 minutes of imaging time. Without additional imaging time, this same image data can be post-processed to yield high-resolution, high-contrast images in any arbitrary orientation. Thus, this new pulse sequence technique provides detailed yet comprehensive coverage. The method of this invention relates to a preparation-acquisition-recovery sequence cycle. The first step is magnetization preparation (MP) period. The MP period can emply a series of RF pulses, gradient field pulses, and/or time delays to encode the desired contrast properties in the form of longitudinal magnetization. A data acquisition period includes at least two repetitions of a gradient echo sequence to acquire data for a fraction of k-space. A magnetization recovery period is provided which allows T1 and T2 relaxation before the start of the next sequence cycle. The MP, data acquisition and magnetization recovery steps are repeated until a predetermined k-space volume is sampled.

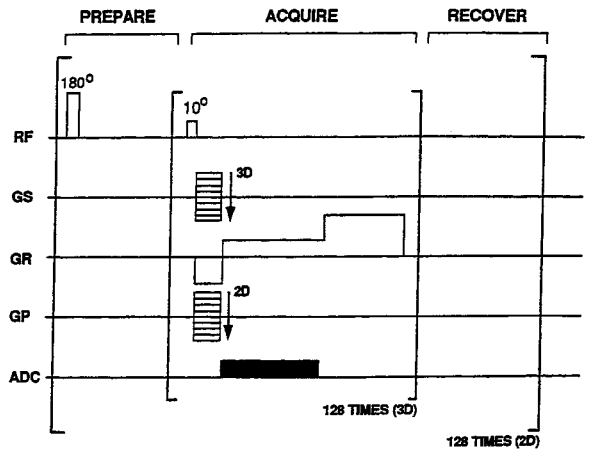

OTHER PUBLICATIONS

John P. Mugler, III et al., Three–Dimensional Magnetization Prepared Rapid Gradient Echo (3D MP Rage) Imaging, 15 Magnetic Resonance in Medicine 152 (1990).

David Norris et al., 3D Flow Imaging With Snapshot Flash, 8(S1) Magnetic Resonance Imaging, SMRI Eight Annual Meeting Program and Abstracts, Feb. 1990, at 15.

A. Haase, Snapshot Flash MRI, Applications to T1, T2, and Chemical–Shift Imaging, 13 Magnetic Resonance in Medicine 77 (Jan. 1990).

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–3, 5–13, 15–19, 22, 26–39 and 44 is confirmed.

Claim 4 is cancelled.

Claim 41 is determined to be patentable as amended.

Claim 42, dependent on an amended claim, is determined to be patentable.

Claims 14, 20, 21, 23–25, 40 and 43 were not reexamined.

41. The method of claim 1, [therein] *wherein* said gradient-echo sequence employs predetermined gradient waveforms to compensate in the sampled signal for phase shifts due to at least one of flow or motion.

* * * * *